(12) United States Patent
Katoda (10) Patent No.: US 7,250,630 B2
(45) Date of Patent: Jul. 31, 2007

(54) ELECTRONIC DEVICES FORMED OF HIGH-PURITY MOLYBDENUM OXIDE

(76) Inventor: Takashi Katoda, 4804-83, Ikku, Kochi-shi, Kochi (JP) 780-8130

( * ) Notice: Subject to any disclaimer, the term of this patent is extended or adjusted under 35 U.S.C. 154(b) by 225 days.

(21) Appl. No.: 10/863,288

(22) Filed: Jun. 9, 2004

(65) Prior Publication Data

US 2004/0251457 A1    Dec. 16, 2004

(30) Foreign Application Priority Data

Jun. 10, 2003   (JP) ............... 2003-164854

(51) Int. Cl.
*H01L 31/0256* (2006.01)
*H01L 29/15* (2006.01)
(52) U.S. Cl. ............... 257/76; 257/110; 257/E29.15
(58) Field of Classification Search ............ 257/76, 257/110
See application file for complete search history.

(56) References Cited

U.S. PATENT DOCUMENTS 6,627,959 B1 *  9/2003  Tuller et al. ............ 257/367

2005/0156197 A1 *  7/2005  Tsutsui et al. ............ 257/200

FOREIGN PATENT DOCUMENTS

JP    2002-217425    *  8/2006

OTHER PUBLICATIONS

Pettus, C., "A Molybdenum-Oxide Negative-Resistance Device", Jan. 1965, Proc. IEEE, vol. 53, No. 1, p. 98.*

* cited by examiner

*Primary Examiner*—Howard Weiss
(74) *Attorney, Agent, or Firm*—Eric J. Robinson; Robinson Intellectual Property Law Office, P.C.

(57) ABSTRACT

The present invention is directed to electronic devices comprising high-purity molybdenum oxide in at least a part of the devices. The devices according to the present such a bipolar transistor, a field effect transistor and a thyristor have a high withstand voltage. The present invention is directed also hostile-environment electron devices formed using high-purity molybdenum oxide. The devices according the present invention can be fabricated at a relatively lower temperature such as 700° C. than that at which GaN or SiC devices are fabricated, the at is a temperature higher than 1000° C.

12 Claims, 6 Drawing Sheets

ELECTRONIC DEVICES FORMED OF HIGH-PURITY MOLYBDENUM OXIDE

BACKGROUND OF THE INVENTION

1. Field of the Invention

The present invention relates to electronic devices with a high withstand voltage and hostile-environment electronic devices.

More particularly, the present invention relates to field effect transistors, bipolar transistors, thyristors with a high breakdown voltage and hostile-environment electronic devices made up of new semiconductor which can solve difficult problems accompanying to such devices made up of known semiconductors with a large bandgap such as gallium nitride (GaN) and silicon carbide (SiC).

2. Related Background Art

Recently so-called power devices such as bipolar transistors, field effect transistors, and thyristors are used in various fields such as domestic electronic articles, cars, machine tools, and illumination. With increase of application, conversion and control of electric power with high efficiency and with a high speed are requested to power devices. Although power devices have been fabricated using silicon (Si) for a long time, limits of silicon devices are predicted. The limits come from the fact that the bandgap of silicon, about 1 electron volt (eV), is small. Research to realize power devices made up of secmiconductors with large bandgaps, that is, so-called widegap semiconductors to overcome the limits has been widely done. In particular, development of power devices using gallium nitride (GaN) whose bandgap is about 3.43 eV or silicon carbide (SiC) whose bandgap is about 3.2 eV has been done extensively.

On the other hand, error or trouble of electronic devices due to noise which comes from the cosmic rays or cars and heat has been serious problems. It has been made clear that so-called hostile-environment devices which are proof against a severe environment with noise or heat should be made of semiconductors with large bandgaps. Development of electronic devices using GaN or SiC has been done from these points. However there are many problems to be solved to realize electronic devices made of GaN or SiC.

The most serious problem is that bulk crystal of GaN has not been obtained because an equilibrium vapor pressure of nitorogen is very high relateive to that of gallium. Therefore, substrates made up of sapphire or silicon carbide (SiC) are used. GaN can not be formed directly on a sapphire substrate because there is lattice mismatch of 16% between sapphire and GaN. Therefore a buffer layer of aluminum nitride (AlN) is formed on a sapphire substrate before growth of GaN. AlN is resistive because it is difficult to dope impurities into AlN. Use of sapphire substrate in a device which includes multi-layers of semiconductor such as a bipolar transistor and a thyristor is very disadvantageous to their structures and fabrication process. On the other hand, SiC substrate is very expensive because bulk crystal of SiC can be grown at a very high temperature of 2200~2400° C. GaN devices using SiC substrate or SiC devices are very expensive.

The second serious problem is to realize new devices which can be grown at a lower temperature than that at which GaN or Sic layers are formed. It is necessary to form layers of GaN or SiC at a temperature higher 1000° C. Large energy is necessary to form semiconductor layers at a high temperature. In addition, there are possiblities that atoms move between layers and a composition is disturbed or dopants move near the interface between layers.

SUMMARY OF THE INVENTION

The present invention is directed to a electronic device comprising high-purity molybdenum oxide in at least a part of the devices.

The device according to the present invention such as a bipolar transistor, a field effect transistor and a thyristor has a high withstand voltage. The present invention is directed to also hostile-environment electronic device made up of high-purity molybdenum oxide.

The device according to the present invention can be fabricated at a relatively lower temperature such as 700° C. than that at which GaN or SiC device is fabricated, that is a temperature higher than 1000° C.

DETAILED DESCRIPTION OF THE PREFERRED EMBODIMENTS

Reference will now be made in greater detail to preferred embodiments of the invention.

The problems described above were resolved by using high-purity molybdenum oxides as at least a part of electronic device such as a field effect transistor, a bipolar transistor and a thyristor.

Molybdenum oxide has been studied for catalyst and its properties are shown, for example, in the following paper. Martin Lerch, Reinhard Schmäcker, Robert Schlögl, "In situ Resonance Raman Studies of Molybdenum Oxide Based Selective Oxidation Catalysts" Fachbereich Chemie der Technischen Universität Berlin zur Erlangung des akademischen Grades, März 2001, Berlin.

The paper is included as a reference literature of this specification. However, application of molybdenum oxide to electronic devices, such as a field effect transistor, a bipolar transistor and a thyristor is not proposed in the paper. Although the bandgap of molybdenum oxide is reported as 2.9~3.15 eV in p.8 of the paper, any effects obtained by using molybdenum oxide in electronic devices are not shown. The values of the bandgap, 2.9–3.15 eV, are the results for molybdenum oxide formed by physical method such as sputtering or deposition in vacuum. In addition, a purity of the sample, that is molybdenum oxide, is not shown in the paper. In general, semiconductor material used in electronic devices is high-purity crystal and its bandgap is measured for such crystal. However the bandgap shown in the above paper is that of molybdenum oxide formed by deposition in vacuum because molybdenum oxide is considered as catalyst in the paper. Material formed by deposition is usually amorphous and it is well known to the people in the art that the material has disordered structure. In addition, a thickness of a film formed by deposition in vacuum is generally small such as 100 nm and a thickness of 1 µm is too large to be formed by deposition in vacuum. When a thickness is small thickness such as 100 nm, property such as a bandgap of a film is affected by a substrate and changes with a thickness of a film or material of a substrate. The bandgap shown above was obtained for such film with a small thickness and was not necessarily identical to that inherent to crystalline molybdenum oxide with a larger thickness such as 1 µm. The reason why a bandgap was not measured for crystalline molybdenum oxide with a thickness larger than 100 nm in the paper described above is considered that application of molybdenum oxide to electronic devices such as various transistors and a thyristor was not intended in the paper.

Figure 1:
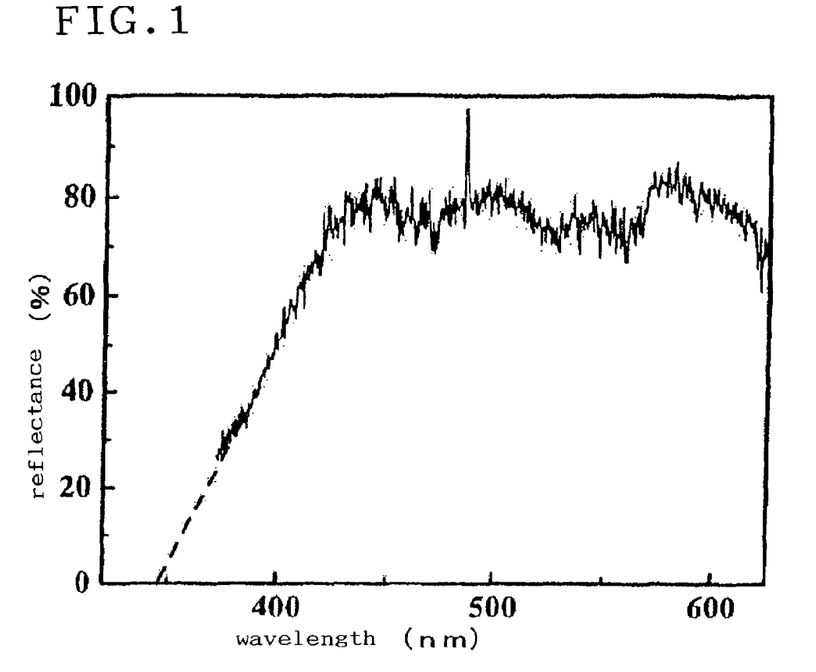
FIG. 1 shows the optical reflection characteristics of the molybdenum oxide formed by oxidation of high-purity molybdenum at 550° C.

The inventor of this invention measured properties of the molybdenum oxide formed by oxidation of a molybdenum plate with a purity of 99.99% in oxygen atmosphere with a purity of 99.9995%. FIG. 1 shows the optical reflection characteristics of the molybdenum oxide formed by oxidation of the molybdenum plate at 550° C. for 120 minutes. A thickness of the molybdenum oxide was 10.2 µm. The longest wavelength at which absorption begins, that is at which reflection is zero which is obtained by extrapolating the spectra shown in FIG. 1 gives the bandgap of the molybdenum oxide. Light with a wavelength shorter than 388 nm was aborbed for this sample. It means that the bandgap of the sample was 3.66 eV. Because a thickness of the sample was 10.2 µm, there is no effect of the substrate and the value of the bandgap must be one inherent to molybdenum oxide. The reason why the value of the bandgap 3.66 eV is larger than that 2.9–3.15 eV reported by Martin Lerch et al as shown in the above paper is considered as follows. It is well known in the art that material with disordered structure such as a film formed by deposition in vacuum forms so-called band tail in the forbidden region of the energy band structure and its effective bandgap is decreased. The value reported by Martin Lerch et al was obtained for samples with disordered structure. On the other hand, the value obtained by the inventor is that for the high-purity crystalline molybdenum oxide. Therefore the value of the bandgap measured by this inventor was larger than those reported by Martin Lerch et al. Following data show in detail the results for high-purity crystalline molybdenum oxide obtained by this inventor.

Figure 2:
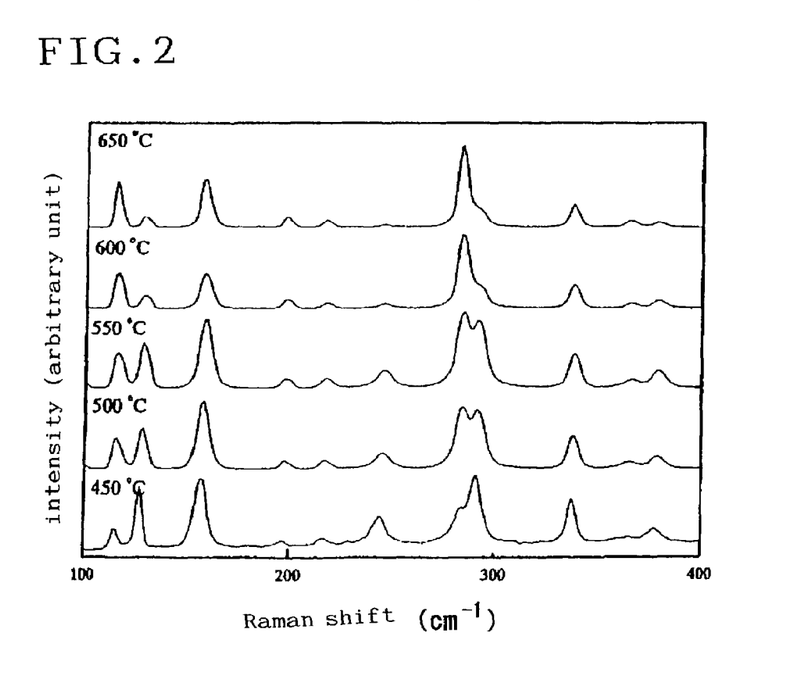
FIG. 2 shows the Raman scattering spectra from molybdenum oxides formed by oxidation of high-purity molybdenum at various temperatures from 450 to 650° C.
Figure 3:
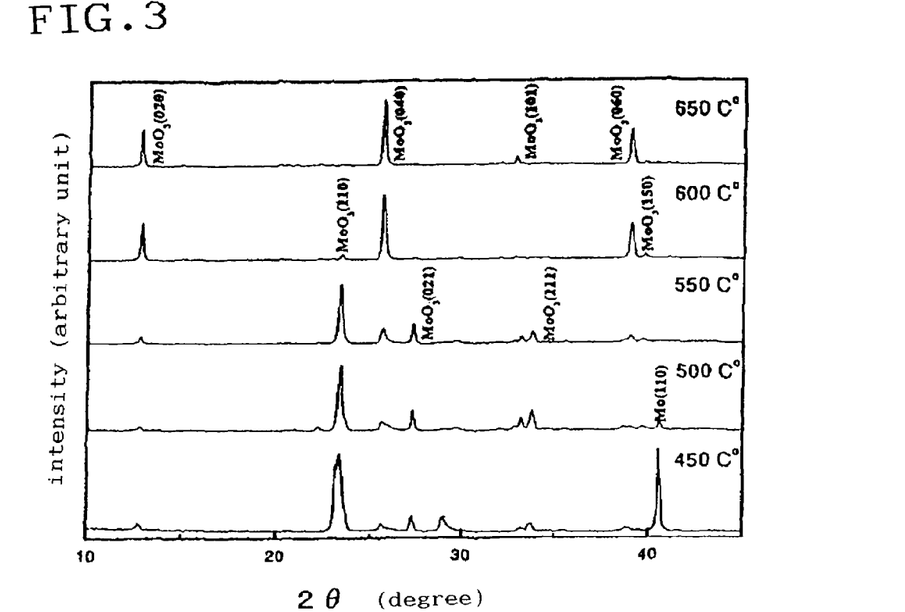
FIG. 3 shows the X-ray diffraction spectra from molybdenum oxides formed by oxidation of high-purity molybdenum at various temperatures from 450 to 650° C.

FIG. 2 shows the Raman scattering spectra and FIG. 3 shows the X-ray diffraction spectra from the molybdenum oxide formed by the method similar to that shown in FIG. 1 except that the molybdenum oxide was obtained by oxidation at a temperature from 450 to 650° C. The spectra shown in FIGS. 2 and 3 mean that the main composition of the molybdenum oxide was $MoO_3$. However it is possible that other compositions were included under the detection limit.

The bandgap obtained from the optical reflection spectra as described for FIG. 1 was 3.45–3.85 eV for the molybdenum oxide formed at 450–650° C. A bandgap is affected by structure, that is crystal or amorphous, disorder of crystal, a size of crystalline particle if the materials which have same composition are poly-crystalline, or strain. Therefore it should be notified that molybdenum oxide with a composition of $MoO_3$ does not have always the bandgap of 3.45–3.85 eV. In other words, the bandgap of 3.45–3.85 eV depends on structure and strain as well as composition. The spectra shown in FIG. 3 consist of sharp peaks and it means that the sample is pure crystal. Moreover, there is possibility that a larger bandgap will be obtained by making quality of the crystal better.

Figure 4:
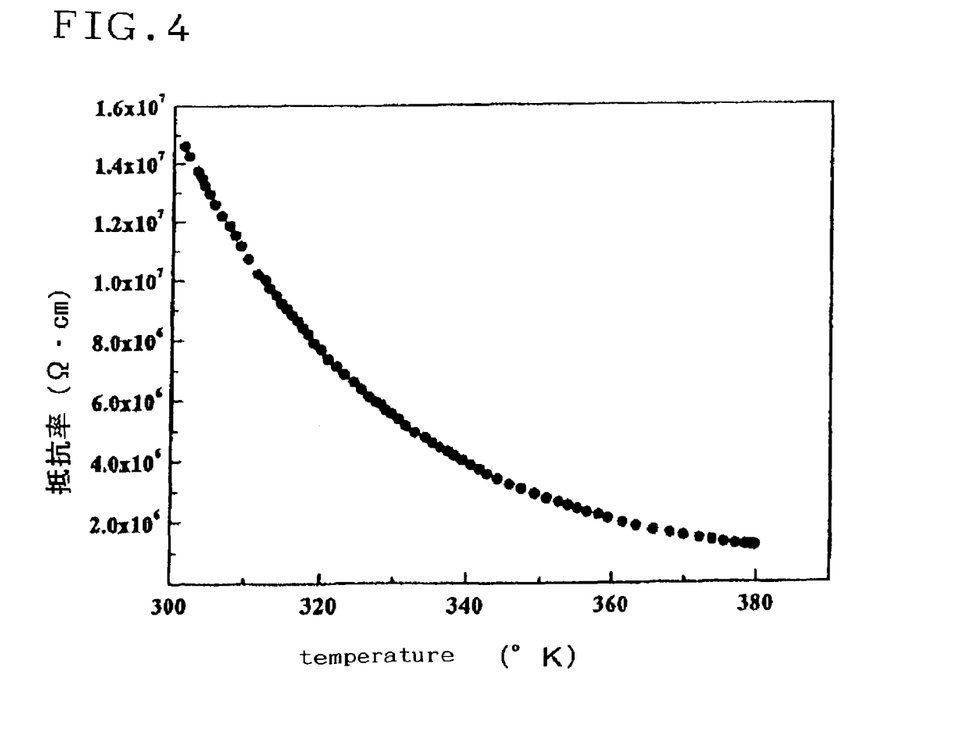
FIG. 4 shows temperature dependence of the electrical resistance of molybdenum oxide formed by oxidation of high-purity molybdenum at 550° C.

FIG. 4 shows temperature dependence of electrical resistance of the molybdenum oxide whose optical reflectance property is shown in FIG. 1. As shown in the figure, resistance decreases with increase of temperature. It means a carrier density increases with increase of temperature and it is phenomenon only semiconductor shows. That is, electrical conductivity which is reciprocal to resistance is determined by a carrier density and carrier mobility. Carrier mobility decreases with increase of temperature because effects of lattice vibration increases with temperature. Therefore if a carrier density does not increase with temperature such as metal or insulating material, conductivity decreases with increase of temperature and resistance will increase. FIG. 4 shows as well as FIG. 1 that the molybdenm oxide is semiconductor.

As shown above, crystalline molybdenum oxide can be obtained by oxidizing a molybdenum plate at a temperature lower than 650° C. A high-quality molybdenum oxide layer can be grown, for example, by vapor phase growth on a buffer layer of molybdenum oxide which has been grown previously on molybdenum oxide, for example, by vapor phase deposition on molybdenum oxide formed by oxidation of a molybdenum plate. Vapor phase growth of molybdenum oxide can be done at a temperature lower than 650° C. by a method which will be applied to the patent. Therefore electronic devices using molybdenum oxide can be fabricated fundamentally at a temperature lower than 650° C. using a molybdenum plate. Other materials such as aluminum (Al) crystal or Zinc sulfide (ZnS) can be used as a substrate. Lattice mismatch between molybdenum oxide and aluminum is 2.0% and that between molybdenum oxide and zinc sulfide is 3.1%. They are much smaller than lattice mismatch between sapphire and gallium nitride, that is 16%. The problems accompanying to the present GaN or SiC electronic devices, that is, use of expensive substrates, growth at a very high temperature and complicated structures and fabrication process are solved by forming electronic devices using fundamentally molybdenum oxide and electronic devices with higher withstand voltages than those of devices formed of GaN and hostile-environment electronic devices are realized. In addition, molybdenum oxide is used to form devices for which a smaller bandgap is preferable by controlling a bandgap, for example, by doping of impurity.

The present invention directed to electronic devices at least in a part made up of high-purity molybdenum oxide having a bandgap larger than 3.45 eV. The devices include a resistance device, a diode, a transistor, a Hall effect device, a thermistor, a varistor, a thyristor and memory devices.

Figure 5:
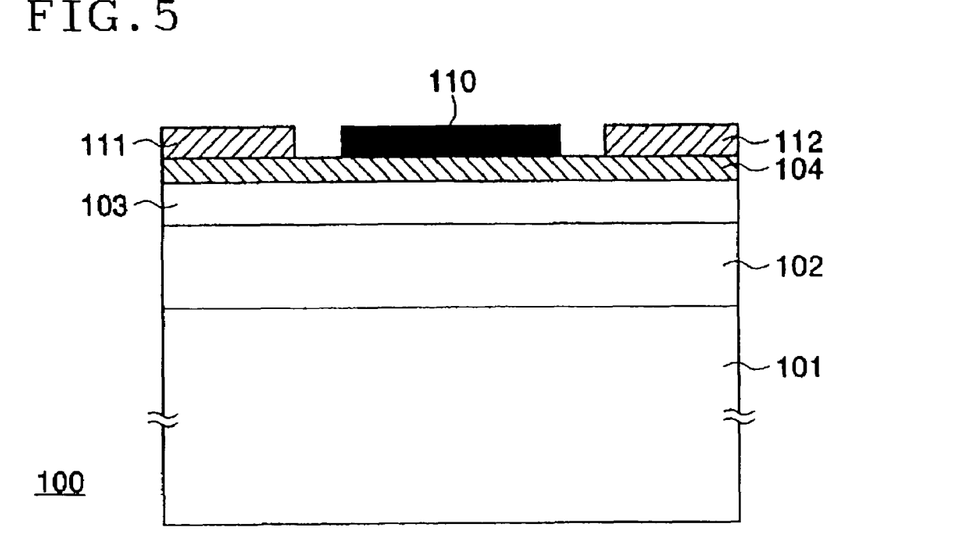
FIG. 5 is a schematic view of a structure of the field effect transistor according to the first embodiment of the present invention.

FIG. 5 is a schematic view of a field effect transistor (100) according to the first emobodiment of the present invention. In the figure, a substrate (101) is made up of molybdenum and conductive. However other materials can be used. A layer (102) of molybdenum oxide which was formed by oxidizing a surface region of the substrate (101) is present on the substrate (101). The layer (102) was formed by oxidation of the substrate (100) at 550° C. for 60 minutes in oxygen atmosphere with a purity of 99.995%. A thickness of the layer (102) is 6.0 µm. A buffer layer (103) is formed on the layer (102) which confines disorder in the layer (102). The disorder originates because the layer (102) and the substrate (101) have different compositions. The layer (103) is formed by, for example, vapor phase growth and its thickness is 4.0 µm. The layer (103) is not doped intentionally and a high resistive layer with a carrier concentration smaller than $1 \times 10^{14}$ cm$^{-3}$. It is not necessary to form the buffer layer (103) when it is not necessary to make the characteristics of the device as good as possible. On the layer (103), a layer (104) of n-type molybdenum oxide with higher quality is formed. The layer (104) of molybdenum oxide is formed, for example, by vapor phase deposition at 630° C. and has a carrier concentration of $3 \times 10^{17}$ cm$^{-3}$ and a thickness of 2.0 µm. Although the layer (104) is not intentionally doped, it is considered that oxygen vacancies function as donors. A Shottky electrode (110) which constitutes of double layers of platinum and gold is formed on the layer (104) as a gate of the field effect transistor (100). The layer (104) is a channel. On the layer (104), a source (111) and a drain (112) electrodes are formed. The electrodes constitute of gold/titanium/gold triple layers.

Figure 6:
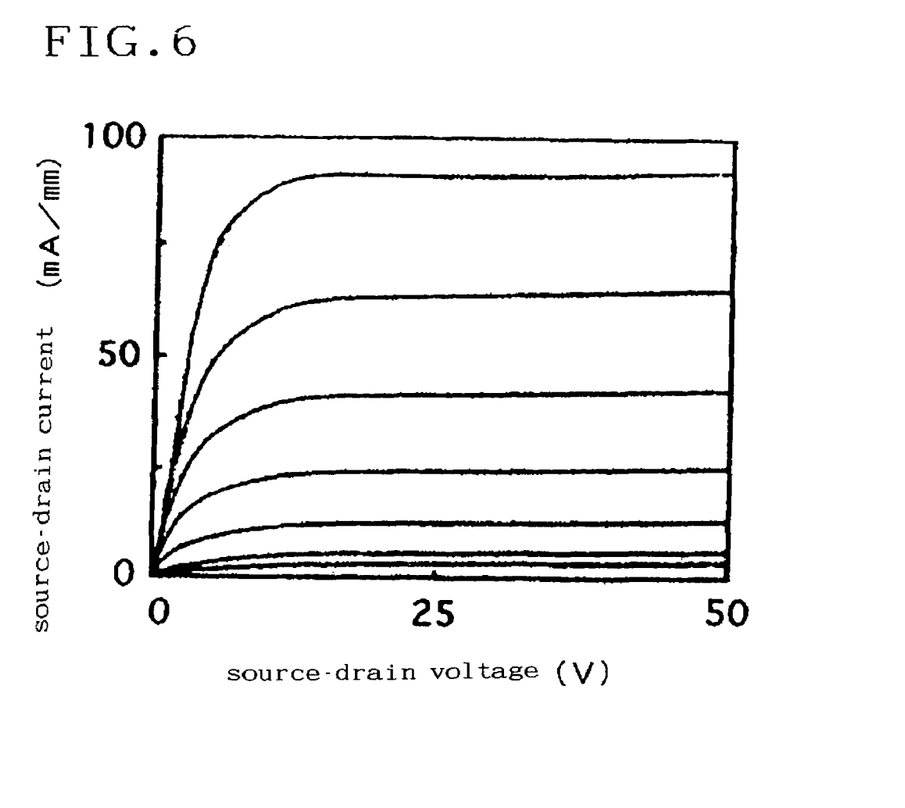
FIG. 6 shows the current-voltage characteristics at 500° C. obtained by simulation for the field effect transistor whose structure is shown in FIG. 5.

It was shown by simulation assuming that a gate length was 2.5 µm and a gate width was 100 µm that the field effect transistor has excellent characteristics with the maximum mutual conductance of 30 mS/mm. FIG. 6 shows the current—voltage characteristics at 500° C. obtained by simulation. It was shown also that it has a stable withstand voltage larger than 100 V. It was assumed in the simulation that the bandgap of molybdenum oxide was 3.75 eV. The results shown above mean that a field effect transistor with a high withstand voltage and an excellent hostile-environment field effect transistor can be realized without use of an expensive substrate and fabrication process at a high temperature by using high-purity molybdenum oxide.

Figure 7:
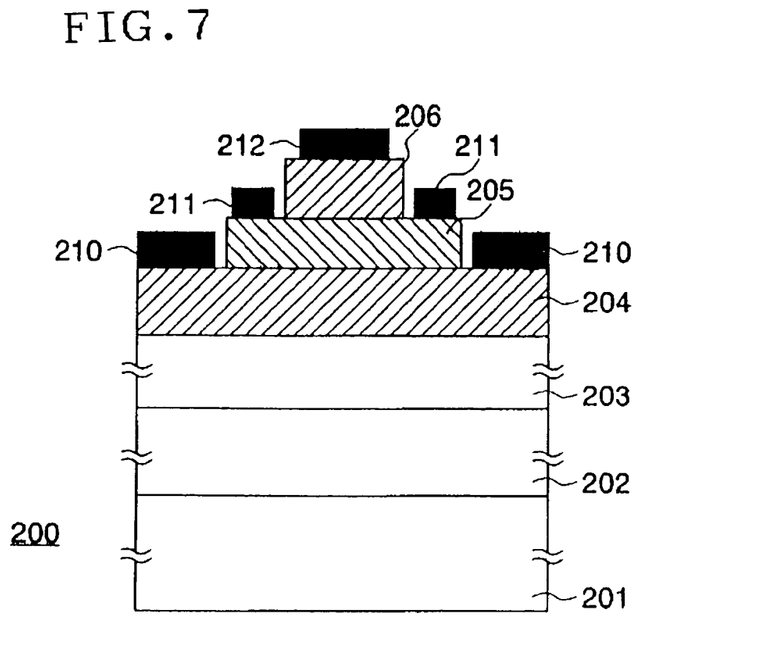
FIG. 7 is a schematic view of a bipolar transistor according to the second embodiment of the present invention.

FIG. 7 is a schematic view of a bipolar transistor (200) according to the second embodiment of the present invention. The bipolar transistor (200) of molybdenum oxide formed by oxidization of a part of the substrate (201). The layer (202) was formed by oxidizing a plate of molybdenum with a purity of 99.99% at 550° C. for 60 minutes in an atmosphere of oxygen with a purity of 99.9995% and had a thickness of 6.0 µm. A buffer layer (203) of molybdenum oxide is formed on the layer (202). The buffer layer (203) is formed, for example, by vapor phase deposition and has a thickness of 4.0 µm m. The buffer layer (203) was not intentionally doped but it was n type because it was grown at a relatively high temperature 630° C. and oxygen vacancies had a function of donor. A layer (204) of n type molybdenum oxide is formed on the buffer layer (203). The layer (204) has a carrier concentration of $6 \times 10^{16}$ cm$^{-3}$ and a thickness of 450 nm. It functions as a collector of the bipolar transistor (200). The layer (204) is formed by, for example, vapor phase deposition at 600° C. The layer (204) has less defects than the buffer layer (203) because of presence of the buffer layer (203). A layer (205) of p-type molybdenum oxide which is doped with magnesium to a carrier concentration of $2 \times 10^{17}$ cm$^{-3}$ and has a thickness of 350 nm is formed on the layer (204). The layer (205) has a function of the base of the bipolar transistor (200). A layer (206) of n-type molybdenum oxide with a carrier concentration of $3 \times 10^{17}$ cm$^{-3}$ and a thickness of 400 nm is formed on the layer (205). The layer (206) has a function as the emitter of the bipolar transistor (200). As shown in FIG. 7, the p-type molybdenum oxide layer (205) is formed on the collector layer (204) except the peripheral region such that a collector electrode (210) is formed on the collector layer (204). Similarly, the emitter layer (206) is formed on the base layer (205) except the peripheral region such that a base electrode (211) can be formed on the base layer (205). An emitter lectrode (212) is formed on the emitter layer (206). The collector (210) and the emitter (212) electrodes are constituted of aluminum/titanium double layers and the base electrode (211) is constituted of nickel/titanium/gold triple layers.

Figure 8:
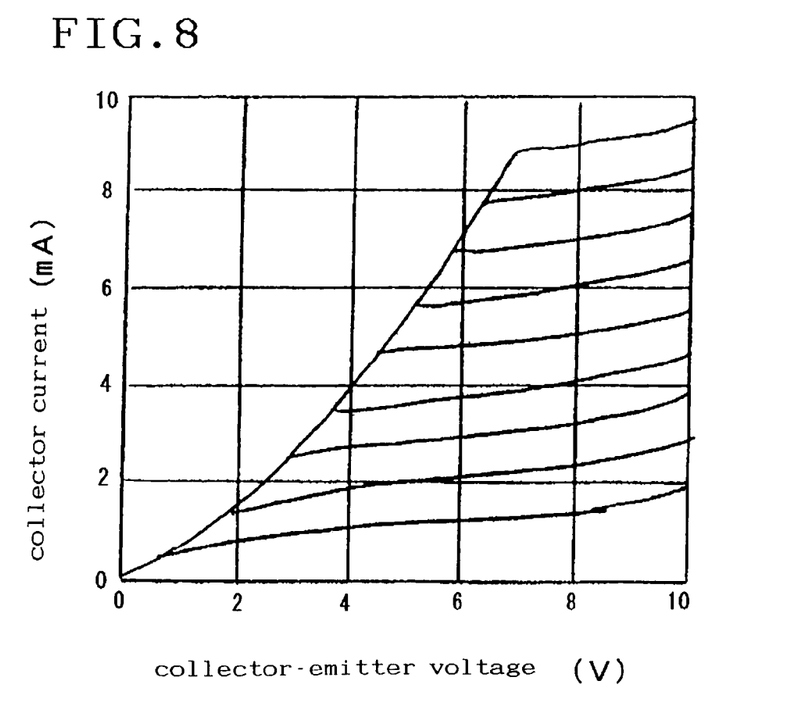
FIG. 8 shows the current-voltage characteristics at 500° C. obtained by simulation for the bipolar transistor whose structure is shown in FIG. 7.

FIG. 8 shows current-voltage characteristics at 500° C. obtained by simulation for the bipolar transistor whose structure is shown in FIG. 7. The characteristics shown in FIG. 8 mean that a bipolar transistor formed of molybdenum oxide functions at a high temperature such as 500° C. It has been reported that a bipolar transistor comprising of GaN functions at 300° C. However a bipolar transistor comprising of molybdenum oxide functions at a higher temperature. Moreover, it does not need an expensive substrate and fabrication process at a temperature higher than 1000° C.

Figure 9:
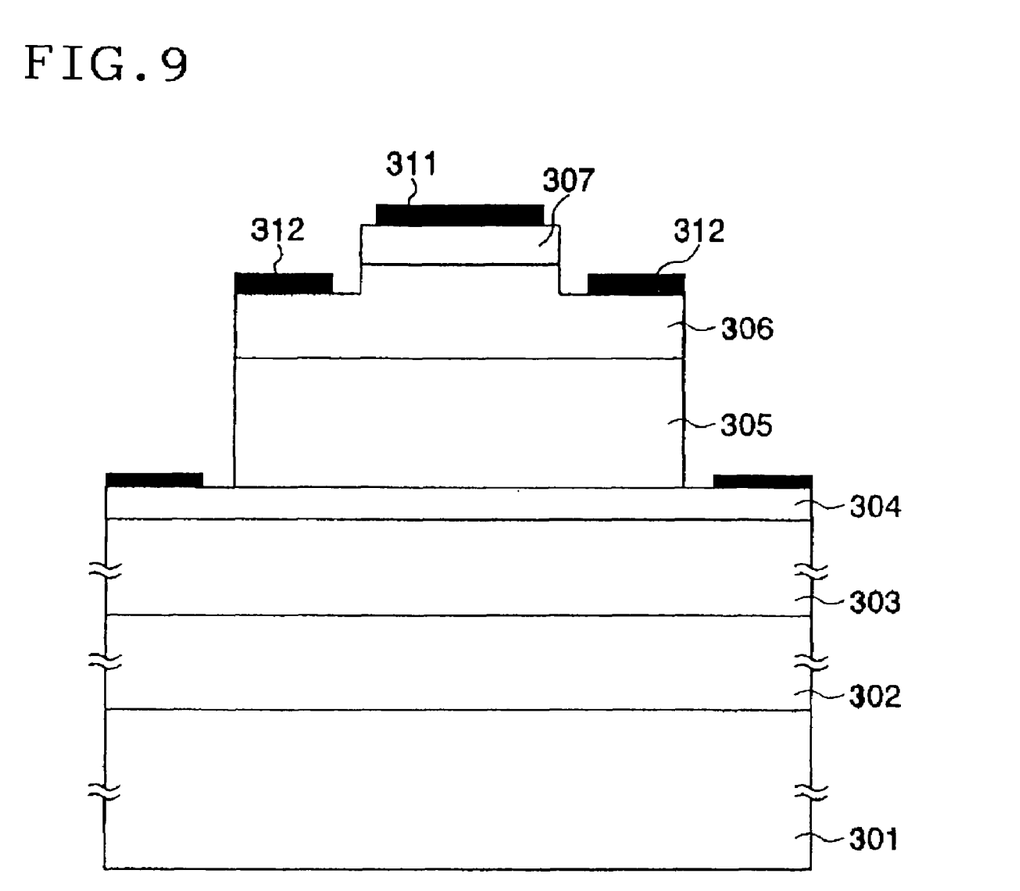
FIG. 9 is a schematic view of a thyristor according to the third embodiment of the present invention.

FIG. 9 is a schematic view of a structure of a thyristor (300) according to the third embodiment of the present invention. Only essential elements to the function are shown in FIG. 9. The thyristor (300) includes a substrate (301) and a layer (302) of molybdenum oxide which was formed by oxidizing a part of the substrate. The layer (302) was formed by oxidizing a molybdenum plate with a purity 99.99% at 550° C. for 60 minutes in an atmosphere of oxygen with a purity of 99.9995%. The layer (302) has a thickness of 6.0 µm and is high resistive. A buffer layer (303) is formed by, for example, vapor phase deposition at 550° C. The buffer layer (303) is formed on the layer (302). The buffer layer (303) is formed by, for example, vapor phase deposition at 550° C. The buffer layer (303) has a thickness of 4.0 µm and is high resistive. A layer (304) of p-type molybdenum oxide is formed on the buffer layer (303). The layer (304) is grown by, for example, vapor phase deposition. It is doped with magnesium to a hole concentration of $7 \times 10^{17}$ cm$^{-3}$ and it has a thickness of 50 nm. A layer (305) of n type molybdenum oxide is formed on the layer (304) except its peripheral region. The layer (305) is formed by, for example, vapor phase deposition. It has an electron concentration of $2 \times 10^{16}$ cm$^{-3}$ by forming at 580° C. although it is not intentionally doped. It's thickness is 160 nm. A layer (306) of p type molybdenum oxide is formed on the layer (305). The layer (306) is doped with, for example, magnesium to a hole concentration of $7 \times 10^{16}$ cm$^{-3}$. It's thickness is 80 nm. A layer (307) of n type molybdenum oxide is grown on the layer (306) except its peripheral region. The layer (307) is formed by, for example, vapor deposition at 630° C. It has an electron concentration of $3 \times 10^{17}$ cm$^{-3}$ and a thickness of 60 nm. A cathode electrode (311) is formed on the layer (307). A gate electrode (312) is formed on the peripheral exposed region of the layer (306) and an anode electrode (313) is formed on the peripheral region of the layer (304). The gate (312) and the anode (313) electrodes are constituted of nickel/titanium/gold triple layers and the cathode electrode (311) is constituted of aluminium/titanium double layers.

Simulation for the thyristor whose structure is shown in FIG. 9 assuming that molybdenum oxide has a bandgap of 3.75 eV showed that the repetitive OFF-state voltage was 5200V, the controllable ON-state current was 5000 A. It is known in the art that a thyristor with almost the same structure formed of SiC has a repetitive OFF-state voltage of 4500V and a controllable ON-state current of 4000A. Therefore a thyristor comprising of molybdenum oxide has superior characteristics to those comprising of SiC. There has been no report on a thyristor comprising of GaN.

Figure 10:
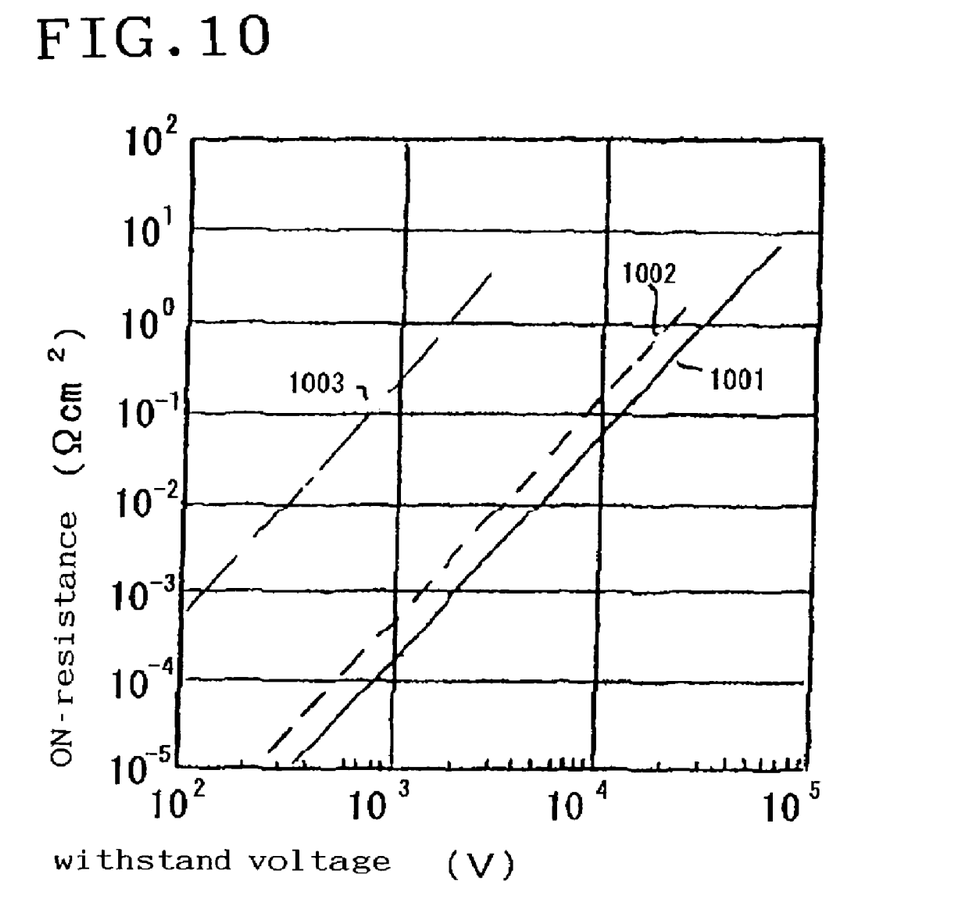
FIG. 10 shows the relation between the withstand voltage and an on-resistance obtained by simulation for the thyristor formed of molybdenum oxide.

FIG. 10 shows the relation between a withstand voltage and an ON-state resistance obtained by simulation for the thyristor shown in FIG. 9. The line (1001) shows the relation for the thyristor formed of molybdenum oxide with a bandgap of 3.75 eV, the line (1002) shows that for SiC device and the line (1003) shows that for Si device. The results shown in FIG. 10 mean that a thyristor with much superior characteristics relative to those of thyristor formed of Si or SiC can be obtained using molybdenum oxide. That is, a thyristor with much superior characteristics than those of known thyristors without using an expensive substrate and fabrication process at a high temperature.

While a structure in which npnp-type conductive layers are included from the top layer on which the cathode electrode is formed to the bottom in illustrated in FIG. 9, a structure in which pnpn-type conductive layers are included from the top to the bottom is also allowable.

It is apparent that a diode which includes one pn junction can be formed if a bipolar transistor which includes two pn junctions can be achieved. Therefore, a pn junction diode is also included in the scope of the present invention.

Here to fore the details of the present invention have been described with reference of some embodiments including transistors and a thyristor. However the spirit of the present invention is not restricted to those devices. The advantageous points of the present invention come from that high purity molybdenum oxide has a large bandgap and can be formed at a relatively low temperature such as 600° C. Various modifications can be derived in the art without departing from the scope of the present invention. All those verifications are included in the scope of the present invention.

What is claimed is:

1. A semiconductor electronic device wherein high-purity molybdenum oxide is used at least in a substantial part, said high-purity molybdenum oxide having a composition of $MoO_3$, wherein said high-purity molybdenum oxide has a bandgap equal to or greater than 3.45 eV.

2. A bipolar transistor wherein high-purity molybdenum oxide is used at least in an emitter, a base or a collector.

3. A thyristor having a device structure consisting of a first p-type molybdenum oxide layer, a first n-type molybdenum oxide layer, a second p-type molybdenum oxide layer and a second n-type molybdenum oxide layer piled-up in this sequence.

4. A thyristor having a first n-type molybdenum oxide layer, a first p-type molybdenum oxide layer, a second n-type molybdenum oxide layer and a second p-type molybdenum oxide layer piled-up in this sequence.

5. A field effect transistor comprising a substrate composed of molybdenum wherein a channel layer is formed using molybdenum oxide.

6. A bipolar transistor comprising a substrate composed of molybdenum wherein molybdenum oxide is used in at least one region of an emitter, a base or a collector.

7. A thyristor comprising a substrate of molybdenum, and a device structure consisting of a first p-type molybdenum oxide layer, a first n-type molybdenum oxide layer, a second p-type molybdenum oxide layer and a second n-type molybdenum oxide layer piled-up in this sequence on said substrate.

8. A thyristor comprising a substrate of molybdenum, and a device structure consisting of a first n-type molybdenum oxide layer, a first p-type molybdenum oxide layer, a second n-type molybdenum oxide layer and a second p-type molybdenum oxide layer piled-up in this sequence on said substrate.

9. A field effect transistor comprising a substrate of molybdenum and, a layer of molybdenum oxide formed by oxidizing a part of said substrate wherein a channel layer is formed using molybdenum oxide.

10. A bipolar transistor comprising a substrate of molybdenum and, a layer of molybdenum oxide formed by oxidizing a part of said substrate wherein molybdenum oxide is used in at least one region of an emitter, a base or a collector.

11. A thyristor comprising a substrate of molybdenum, a layer of molybdenum oxide formed by oxidizing a part of said substrate and a device structure formed on said substrate, a first p-type molybdenum oxide layer, a first n-type molybdenum oxide layer, a second p-type molybdenum oxide layer and a second n-type molybdenum oxide layer piled-up in this sequence.

12. A thyristor comprising a substrate of molybdenum, a layer of molybdenum oxide formed by oxidizing a part of said substrate and a device structure formed on said substrate, wherein said device structure consists of a first n-type molybdenum oxide layer, a first p-type molybdenum oxide layer, a second n-type molybdenum oxide layer and a second p-type molybdenum oxide layer piled-up in this sequence.

* * * * *